United States Patent [19]
Zhu et al.

[11] Patent Number: 5,734,605
[45] Date of Patent: Mar. 31, 1998

[54] MULTI-LAYER MAGNETIC TUNNELING JUNCTION MEMORY CELLS

[75] Inventors: Xiaodong T. Zhu, Chandler; Herbert Goronkin; Saied N. Tehrani, both of Tempe, all of Ariz.

[73] Assignee: Motorola, Inc., Schaumburg, Ill.

[21] Appl. No.: 711,751

[22] Filed: Sep. 10, 1996

[51] Int. Cl.⁶ .................................................. G11C 11/15
[52] U.S. Cl. .................................. 365/173; 365/158
[58] Field of Search ................................. 365/173, 158

[56] References Cited

U.S. PATENT DOCUMENTS

| | | | |
|---|---|---|---|
| 3,480,929 | 11/1969 | Bergman | 365/173 |
| 4,887,236 | 12/1989 | Schloemann | 365/173 |
| 5,289,410 | 2/1994 | Katti et al. | 365/173 |
| 5,343,422 | 8/1994 | Kung et al. | 365/158 |

*Primary Examiner*—Joseph A. Popek
*Assistant Examiner*—Michael T. Tran
*Attorney, Agent, or Firm*—Eugene A. Parsons

[57] ABSTRACT

A multi-state, multi-layer magnetic memory cell including a first conductor, a first magnetic layer contacting the first conductor, an insulating layer on the first magnetic layer, a second magnetic layer on the insulating layer, a second conductor contacting the second magnetic layer, and a word line adjacent, or in contact with, the cell so as to provide a magnetic field to partially switch magnetic vectors along the length of the first magnetic layer. Information is stored by passing one current through the word line and a second current through the first and second conductors sufficient to switch vectors in the first and second magnetic layers. Sensing is accomplished by passing a read current through a word line sufficient to switch one layer (and not the other) and a sense current through the cell, by way of the first and second conductors, and measuring a resistance across the cell.

21 Claims, 4 Drawing Sheets

MULTI-LAYER MAGNETIC TUNNELING JUNCTION MEMORY CELLS

FIELD OF THE INVENTION

The present invention pertains to memory cells and more specifically to multi-layer magnetic memory cells.

BACKGROUND OF THE INVENTION

In the past, a variety of magnetic materials and structures have been utilized to form magnetoresistive materials for non-volatile memory elements, read/write heads for disk drives, and other magnetic type applications. One prior magnetoresistive element utilized a magnetoresistive material that has two magnetic layers separated by a conductor layer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials. Additionally, reading the state of such memories typically requires a two-phase read operation that results in very long read cycles. The two phase read operation also requires extra circuitry to determine the state of the memory, thus increasing the cost of such memories. An example of such a magnetic material and memory is disclosed in U.S. Pat. No. 4,780,848 issued to Daughton et al. on Oct. 25, 1988.

Another prior material uses multi-layer giant magnetoresistive materials (GMR) and utilizes submicron width, in order to increase density. In this structure the magnetization vectors are parallel to the length of the magnetic material instead of the width. In one embodiment the magnetization vector of one magnetic material layer is always maintained in one direction while the magnetization vector of the second magnetic layer switches between parallel and anti-parallel to the first vector in order to represent both logical "0" and "1" states. In order to determine the logical state of a memory cell utilizing this material, the memory cell has a reference cell and an active cell. The reference cell always provides a voltage corresponding to one state (either always a "1" or always a "0"). The output of the reference cell is compared to the output of the active cell in order to determine the state of the memory cell. The requirement for an active and a reference cell reduces the density of a memory that utilizes such elements. Additionally, each memory cell requires transistors to switch the active and reference cells at appropriate times in order to read the cells. This further increases the cost of the memory.

A magnetic random access memory (MRAM) is a non-volatile memory which basically includes a giant magnetoresistive (GMR) material, a sense line, and a word line. The MRAM employs the GMR effect to store memory states. Magnetic vectors in one or all of the magnetic layers of GMR material are switched very quickly from one direction to an opposite direction when a magnetic field is applied to the GMR material over a certain threshold. According to the direction of the magnetic vectors in the GMR material, states are stored, for example, one direction can be defined as a logic "0", and another direction can be defined as a logic "1". The GMR material maintains these states even without a magnetic field being applied. The states stored in the GMR material can be read by passing a current through the cell in a sense line, because of a difference between the resistances of the two magnetic states. Since GMR materials are composed of very conductive non-magnetic layers (generally copper or the like) and conductive magnetic layers (e.g., Fe, Ni, Co, etc.), the sheet resistance of the material is relatively low (e.g. 15 ohms/square) and the change in resistance is relatively small (e.g. 5%). Consequently, the resistance difference between the two states for a cell with length-to-width ratio of ten is only about 7.5 ohms.

Accordingly, it is highly desirable to provide magnetic random access memories and memory cells which have higher resistance differences between the two magnetic states and thus are easier to utilize.

It is a purpose of the present invention to provide a new and improved multi-state, multi-layer magnetic memory cell.

It is another purpose of the present invention to provide a new and improved array of multi-state, multi-layer magnetic memory cells.

It is still another purpose of the present invention to provide a new and improved multi-state, multi-layer magnetic memory cell which is simpler to manufacture and to use.

It is a further purpose of the present invention to provide a new and improved multi-state, multi-layer magnetic memory cell which utilizes less sensing current and produces a larger change between states.

It is still a further purpose of the present invention to provide a new and improved multi-state, multi-layer magnetic memory cell which is faster and simpler to sense.

SUMMARY OF THE INVENTION

The above problems and others are at least partially solved and the above purposes and others are realized in a multi-state, multi-layer magnetic memory cell including a first electrically conductive portion positioned adjacent or on the surface of a substrate, a first layer of magnetic material supported on the substrate in electrical contact with the first electrically conductive portion, a layer of insulating material positioned on the first layer of magnetic material, a second layer of magnetic material positioned on the layer of insulating material, and a second electrically conductive portion positioned in electrical contact with the second layer of magnetic material. The first layer of magnetic material, the layer of insulating material and the second layer of magnetic material forming a multi-layer magnetic memory cell with the first and second electrically conductive portions completing a circuit through the cell.

An electrically conductive word line is positioned adjacent the multi-layer magnetic memory cell so as to provide a magnetic field, when the word line is activated, sufficient to at least partially switch magnetic vectors in one of the first and second layers of magnetic material from a first direction along a length of the one to a second, opposite direction, along the length of the one. Sensing stored data is accomplished by passing a sense current through the multi-layer magnetic memory cell, by way of the first and second electrically conductive portions, and measuring a voltage drop or a resistance change across the multi-layer magnetic memory cell.

Generally, a plurality of the multi-layer magnetic memory cells are fabricated in an array including a plurality of rows of cells and a plurality of columns of cells. In one specific embodiment, all of the cells in each row are connected in series by connecting alternate adjacent first electrically conductive portions together and by connecting alternate adjacent second electrically conductive portions together. The series circuit making up each row of cells then operates as a sense line. A single control transistor can be connected to one end of the sense line (each row) to control current flow therethrough.

In another embodiment a plurality of diodes is included, one each associated with each cell. A first terminal of the associated diode is connected in series with each cell by way of one of the electrically conductive portions. One electrically conductive portion of each cell is then connected to the word line and the opposite terminal of the diode is connected to a sense line.

In yet another embodiment a plurality of transistors are included, one for each cell, with one current carrying terminal of a transistor being connected in series with an associated cell by way of one of the electrically conductive portions. One electrically conductive portion of each cell is then connected to the word line and the opposite current carrying terminal of the transistor is connected to a sense line. A third plurality of lines, designated activating lines herein, are connected, one each per row of cells, to the control terminals of transistors in the rows.

BRIEF DESCRIPTION OF THE DRAWINGS

Referring to the drawings.

DESCRIPTION OF THE PREFERRED EMBODIMENTS

Figure 1:
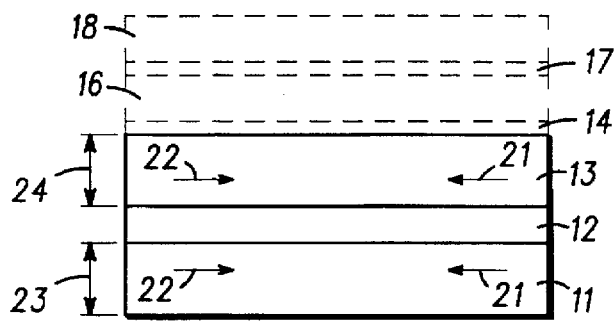
FIG. 1 is a simplified side view of a multi-layer magnetic memory cell in accordance with the present invention.

Turning now to the drawings, FIG. 1 illustrates an enlarged, simplified side view of a magnetic memory cell 10 having multiple layers that are ferromagnetically coupled. Cell 10 includes a first magnetic layer 11 and a second magnetic layer 13, which are separated by a first insulating spacer layer 12. Magnetic layers 11 and 13 each can be single layers of ferromagnetic materials such as a layer of nickel, iron, cobalt, or alloys thereof including alloys having palladium or platinum therein. Alternatively, either of layers 11 and 13 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 12 include most non-conductive materials such as oxides, nitrides, dielectrics, etc.. Additionally, layer 11 has a thickness 23 and layer 13 has a thickness 24 that is the same as or greater than thickness 23. The reasons for the different thicknesses or different ferromagnetic materials are explained hereinafter.

Although shown having two magnetic layers in this embodiment, cell 10 can have more than two magnetic layers including a third magnetic layer 16, and a fourth magnetic layer 18, that typically are similar to layers 11 and 13 but may be formed of different materials or have different thicknesses, and are separated by a second non-conductive spacer layer 14 and a third non-conductive spacer layer 17 that are similar to layer 12. For sake of simplicity of the following explanation, layers 14, 16, 17, and 18 are omitted and consequently are shown in phantom simply to aid in understanding the different embodiment.

Figure 2:
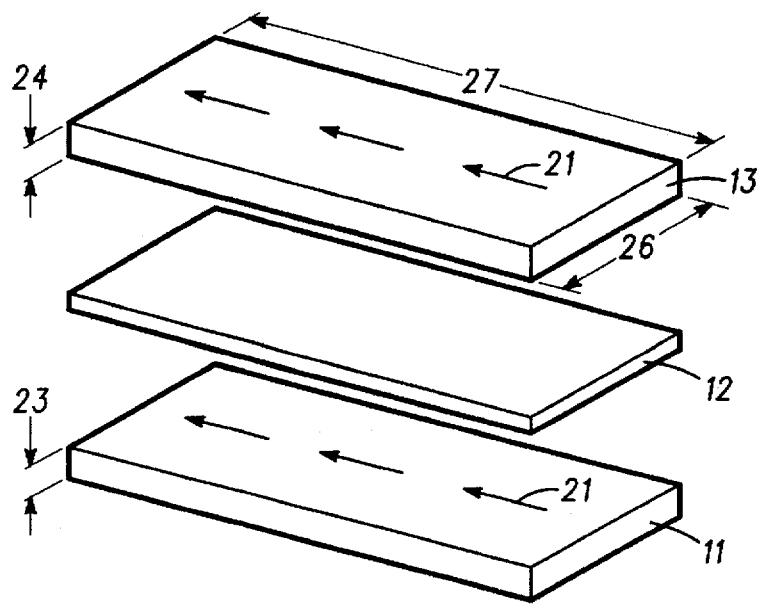
FIG. 2 is a simplified exploded view of the multi-layer magnetic memory cell illustrated in FIG. 1.

Turning now to FIG. 2, an enlarged exploded view of cell 10 is illustrated. Portions of FIG. 2 that have the same reference numbers as FIG. 1 are the same as the corresponding FIG. 1 elements. In the preferred embodiment, layers 11 and 13 are rectangular and are formed with the easy axis of magnetization along a length 27 and not along a width 26. Layers 11 and 13 each have magnetization vectors 21 that are positioned substantially along length 27, that is, substantially parallel to length 27. Additionally width 26 is formed to be smaller than the width of the magnetic domain walls or transition width within layers 11 and 13. Consequently, vectors 21 can not be parallel to width 26. Typically, widths of less than 1.0 to 1.2 microns result in such a constraint. In the preferred embodiment, width 26 is less than one micron and is as small as can be made by manufacturing technology, and length 27 is greater than width 26, generally five times or greater.

As illustrated in FIG. 1, vectors 21 and 22 in layers 11 and 13 represent two different states of magnetization within cell 10. It should be understood that these are the same vectors and that they are given different numbers only to indicate different states. One state is referred to as a logic "0" and the other state is a logic "1". While it will be understood by those skilled in the art that any logic definition can be assigned to either state, in this example when vectors 21 of layers 11 and 13 both point to the left in FIG. 1, cell 10 is in a logic "0" state and when vectors 22 in both layers 11 and 13 are in the opposite direction cell 10 is in a logic "1" state. Thus, for a first state magnetization vectors in both layers 11 and 13 point in a first direction and for a second state magnetization vectors in both layers 11 and 13 point in an opposite direction. Also, because layers 11 and 13 are ferromagnetically coupled the magnetic vectors of layers 11 and 13 are always pointing in the same direction (parallel) when no (or a very small) magnetic field is applied to cell 10. The magnetic vectors are only pointing in opposite directions (antiparallel) when specific magnetic fields are applied to cell 10, as will be explained in more detail presently.

It should be understood by those skilled in the art that the structure of the present invention can be operated with modes other than the preferred ferromagnetic modes. Two examples are the antiferromagnetic mode and the spin valve mode. In the antiferromagnetic mode, the resting states of the two magnetic layers 11 and 13 are either clock-wise or anti-clock-wise antiparallel orientations of vectors 21 and 22. These two states can be used as logic "0" and logic "1" states. In the spin valve mode, one of the layers 11 and 13 is pinned and the other layer can be switched to be either parallel or antiparallel to the pinned layer. The parallel and antiparallel states of vectors 21 and 22 can be used as logic "0" and logic "1" states.

In this specific example, cell 10 is designed with layer 13 thinner than layer 11 so that a smaller magnetic field will switch the magnetization vectors of layer 13 than is required to switch the magnetization vectors of layer 11. Another way to accomplish this design is to form layer 11 out of magnetic material that requires a higher magnetic field to switch the magnetization vectors.

The provision of insulating layer 12 between ferromagnetic layers 11 and 13 produces a tunneling junction which allows a flow of current perpendicularly through layer 12, from layer 11 to layer 13 (or vice versa). Essentially, cell 10 appears as a relatively high impedance (referred herein to as a resistance R), generally several thousand ohms, e.g. 5 to 6 kohms. When the magnetization vectors in layers 11 and 13 are antiparallel the resistance R of cell 10 remains very high. When the magnetization vectors in layers 11 and 13 are antiparallel, the resistance R of cell 10 drops perceptibly.

In a specific example, layer 11 is formed of cobalt (Co) approximately 1000 Å thick, layer 12 is formed of aluminum oxide ($Al_2O_3$) approximately 100 Å thick, and layer 13 is formed of nickel iron (NiFe) approximately 1000 Å thick. The change of resistance versus the resistance (DR/R) is approximately 15% in the present specific example. Thus, the state of cell 10 is relatively easily sensed by applying a specific magnetic field to cell 10 and passing a sense current therethrough from layer 11 to layer 13 (or vice versa). Any change of resistance in cell 10 is easily read as a change in voltage drop across cell 10 which can conveniently be used in conjunction with memory arrays and the like. Utilizing the ratio DR/R=15%, it is clear that the change in voltage across cell 10 versus the voltage across cell 10 (DV/V) becomes 15%. Thus, in this example in which the resistance of cell 10 is 6 kohms, the change of voltage (DV) across cell 10 is approximately 90 mV for a 0.1 mA sensing current passing through cell 10.

Figure 3:
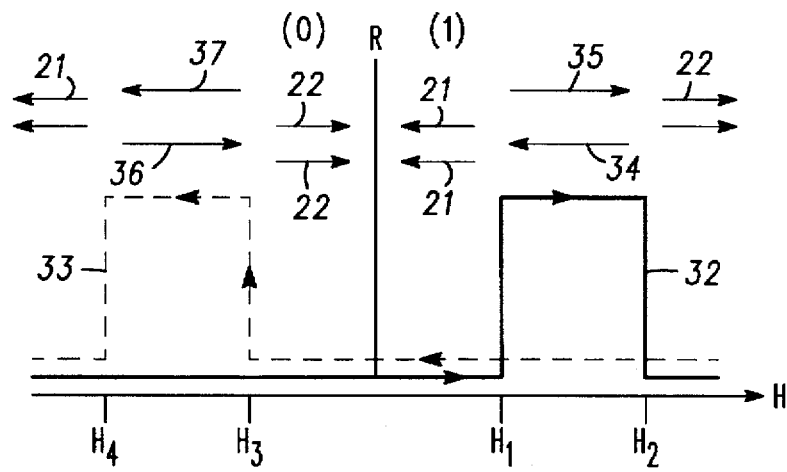
FIG. 3 is a graph illustrating characteristics of the cell of FIG. 1.

Referring specifically to FIG. 3, a graph is illustrated showing the resistance of cell 10 versus different directions of orientation for the magnetic vectors in layers 11 and 13. Also, the direction and strength of an applied magnetic field, required to achieve the various vector directions is shown. The abscissa of the graph indicates magnetic field direction and strength and the ordinate represents the resistance of cell 10. Further, a first curve 32 indicates the cell resistance which can be achieved for the application of various strengths of a magnetic field in a first direction and curve 33 indicates the cell resistance which can be achieved for the application of various strengths of a magnetic field in a second direction. Vectors 34 and 35 are illustrated with curve 32 and represent the magnetic vectors in layers 11 and 13, respectively, for the application of a magnetic field between values $H_1$ and $H_2$ in the positive direction along the abscissa. Similarly, vectors 36 and 37 are illustrated with curve 33 and represent the magnetic vectors in layers 11 and 13, respectively, for the application of a magnetic field between values $H_3$ and $H_4$ in the negative direction along the abscissa.

Assuming cell 10 is in the state in which vectors 21 both point to the left, moving to the right along the abscissa, the magnetic field increases up to a value $H_1$. Before the value Hi is reached, magnetic vectors 21 are oriented in the same direction, designated a logic "1", and the resistance of cell 10 is low. Upon applying sufficient magnetic field to cell 10, herein designated by the value $H_1$, vector 35 switches to an opposite direction (as shown) and the resistance of cell 10 increases perceptibly. As the magnetic field is increased beyond a value $H_2$ vector 34 also switches to an opposite direction and the resistance of cell 10 again drops to a low value with the magnetic vectors now being represented by vectors 22. Similarly, if the magnetic field is applied in the opposite direction curve 33 applies and magnetic vector 37 of layer 13 switches at a value $H_3$ and the magnetic vector 38 of layer 11 switches at a value $H_4$, with the magnetic vectors now being represented by vectors 22. It should be noted that once the vectors of layers 11 and 13 are set in the orientation depicted by vectors 21 or 22 they will remain in that orientation, even after the applied magnetic field is removed, until a magnetic field sufficiently strong to switch them is applied.

Further, the distance or field strength (operating range) between, $H_1$ and $H_2$, or $H_3$ and $H_4$, is determined by the materials used in cell 10 and the various dimensions of the layers. Generally, cell 10 is designed to provide a wide operating range. Thus, in this example and assuming that the magnetization vectors of layer 11 are set in the orientation indicated by curve 32 (vector 34) the cell can be set to a logic "0" (parallel magnetization vectors pointing right in FIG. 3) by applying a field with a strength greater than $H_2$, e.g. 50 Oersteds. Also, the cell can be set to a logic "1" (parallel magnetization vectors pointing left in FIG. 3) by applying a magnetic field greater than $H_4$, e.g. −50 Oersteds.

The following procedure can be used to read stored states in magnetic memory cell 10. Assuming that the vectors of layers 11 and 13 are set in the orientation indicated by curve 33 (vectors 22), applying a positive magnetic field to cell 10 (either $H_1$ or $H_2$) has no effect, which is an indication that the cell has a logic "0" stored therein. Conversely, applying a negative magnetic field to cell 10 between the values $H_4$ and $H_3$, will cause the magnetic vector in layer 13 to switch (vectors 36 and 37) to an antiparallel position and the substantial change in resistance of the cell can be detected as described above. In a similar fashion, when vectors of layers 11 and 13 are set in the orientation indicated by curve 32 (vectors 21), applying a negative magnetic field to cell 10 (either $H_3$ or $H_4$) has no effect indicating that the cell has a logic "1" stored therein. Conversely, applying a positive magnetic field to cell 10 between the values $H_1$ and $H_2$, will cause the magnetic vector in layer 13 to switch (vectors 34 and 35) to an antiparallel position and the substantial change in resistance of the cell is easily detected.

Figure 4:
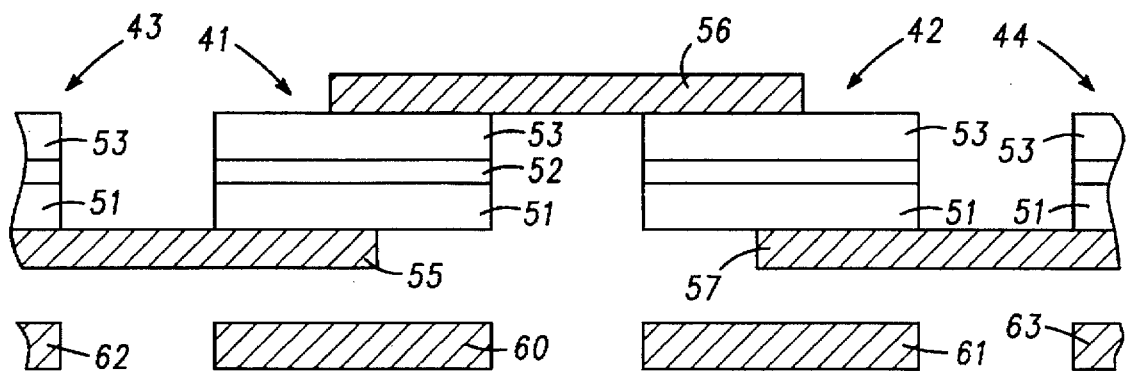
FIG. 4 is a simplified sectional view of an array of cells, similar to that illustrated in FIG. 1, connected in a first embodiment.

FIG. 4 is a simplified sectional view of an array 40 of cells, similar to that illustrated in FIG. 1, connected in a first embodiment. It will of course be understood that for convenience FIG. 4 illustrates only a portion of a single row of cells in array 40 and that array 40 extends into and out of the paper as well as to the left and right. An adjacent pair of cells 41 and 42 are illustrated in their entirety with cells 43 and 44 partially illustrated for simplicity. Cell 41 includes first and second layers 51 and 53 of magnetic material with a layer 52 of insulating material sandwiched therebetween. Similarly, cells 42, 43, and 44 each include first and second layers 51 and 53 of magnetic material with a layer 52 of insulating material sandwiched therebetween. The various layers of material in the cells are numbered similarly herein because they will generally be fabricated from common layers of material.

Figure 5:
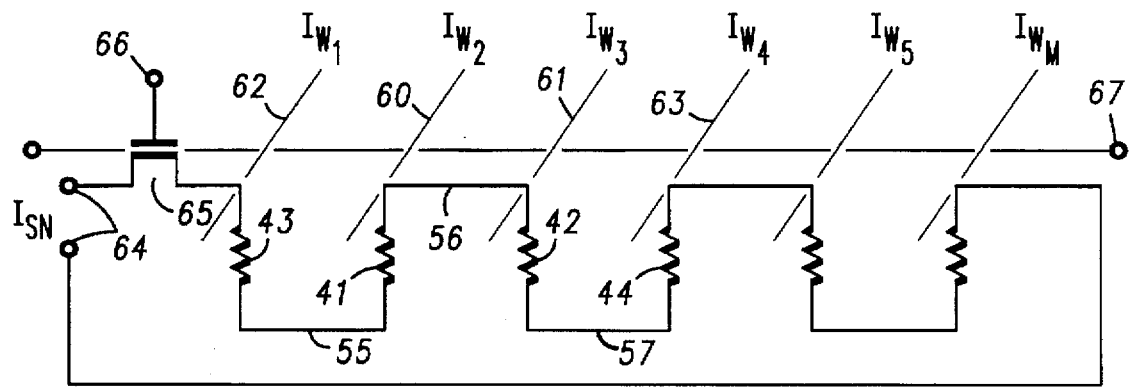
FIG. 5 is a schematic representation of the array of cells illustrated in FIG. 4.

An electrically conductive portion 55 is positioned in electrical contact with layer 51 of cell 43 and layer 51 of adjacent cell 41. Also, an electrically conductive portion 56 is positioned in electrical contact with layer 53 of cell 41 and layer 53 of adjacent cell 42. Further, an electrically conductive portion 57 is positioned in electrical contact with layer 51 of cell 42 and layer 51 of adjacent cell 44. Since each of the cells 41–44 is a tunneling junction cell that conducts current through the insulating layer from one magnetic layer to the other, electrically conductive portions 55, 56, and 57 connect cells 41–44 into a series circuit. A simplified schematic diagram of a row of cells in array 40 is illustrated in FIG. 5. Each cell in the row is represented by a resistance and electrically conductive portions are represented by a direct connection between adjacent cells.

An electrically conductive word line 60 is positioned adjacent cell 41 so as to provide a magnetic field around cell 41 when word line 60 is activated. Similar word lines 61, 62, and 63 are provided adjacent cells 42, 43, and 44, respectively. Word line 60 receives current to provide a sufficient magnetic field to at least partially switch the magnetization vectors in one of magnetic layers 51 or 53 (in this specific example layer 53) from a first direction along the length of the layer to a second, opposite direction along the length of the layer. In this specific example, the series connected cells form a sense line having end terminals 64. A transistor 65 is connected in series in the sense line and is activated by a signal which turns on transistor 65 to complete a series circuit between end terminals 64. A small sensing current can then be passed through the sense line to determine changes in the resistance, as the word lines are activated to partially switch the various cells making up the sense line. In this way the state of each cell can be conveniently and easily sensed.

Generally, additional current must be applied to each cell to create sufficient magnetic field which, in conjunction with the magnetic field created by the current in the word line, sets a specific cell to a desired state. While this current could be applied through the sense line, this is not preferred because each cell in the sense line has a relatively high resistance (5 to 6 kohms) so that a relatively large amount of power would be expended. In a preferred embodiment a second line (one per row of cells), herein referred to as a write line and designated 67 in FIG. 5, is included and extends generally parallel with the sense line and perpendicular to the word lines. To write data (store a desired state) in the cells the word and write lines are activated so that approximately one half the required write current is applied to each of the selected lines. As in the sensing procedure, a specific cell is selected by selecting the word line and the write line that crosses at that cell. The magnetic fields produced by current flowing in the lines combines to produce a sufficient amount of switching magnetic field at the selected cell and only at the selected cell.

Assume for example that fifty Oersteds are required to switch the magnetization vector of layers 51 and 53 in cell 41. Sufficient current is then applied to word line 60 to create a magnetic field having a strength of thirty Oersteds. By applying sufficient current to line 67 associated with cell 41, a magnetic field having a strength of thirty Oersteds is created by line 67. The two magnetic fields combine at cell 41 (and only at cell 41) to create a total magnetic field sufficient to change the magnetization vectors of layers 51 and 53 of cell 41. Thus, cell 41 has been uniquely addressed and set to a desired state, depending upon the direction of the magnetic field created. Since word line 60 and line 67 cross only at cell 41 the combined magnetic field is created only at cell 41.

A process for reading the cells in each row is relatively easy and fast. First, a sense signal is applied between end terminals 64 of the selected row. This signal is large enough to read a change in resistance but well below the threshold level which will cause the magnetization vectors to switch. Second, a signal of sufficient amplitude to cause layer 53 to switch (with or without the sense current) into an antiparallel direction is applied to the word line corresponding to the cell it is desired to read. For example, a current sufficient to produce a positive magnetic field $H_1$ is applied to word line 62 to read cell 43. If an increase in resistance is detected with the sense signal, cell 43 is in the "1" state, and if no change in resistance is detected with the sense signal, cell 43 is in the "0" state. Each of the other cells in the row can be tested by applying a similar current to the associated word line.

Figure 6:
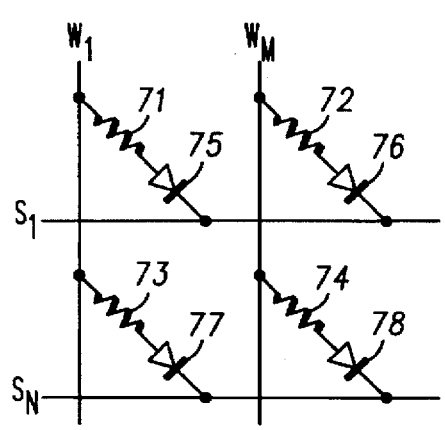
FIG. 6 is a schematic representation of another embodiment of an array of cells similar to those illustrated in FIG. 1.

Turning now to FIG. 6, another embodiment of an array 70 of cells similar to cell 10 in FIG. 1 is illustrated with the cells being oriented in rows and columns. Only four cells 71 through 74 are illustrated for convenience, but it will be understood that any desired number of cells which can be practically fabricated can be employed. A plurality of diodes 75 through 78 are supplied, one each being associated with each cell 71 through 74. In this embodiment, one terminal of the associated diode is connected to the lower or upper magnetic layer of the associated cell by means of an electrically conductive portion, which may include material such as a conductive layer, or solder, or the diodes may be integrated into a substrate or upper layer and formed with the conductive portion as a portion of the diode. A second terminal of the diode is connected to a sense line and the other of the first and second magnetic layers of the cell are connected to a word line.

In FIG. 6, cell 71 has a magnetic layer connected to one terminal of diode 75 and the other magnetic layer connected to a word line W1. The second terminal of diode 75 is connected to a sense line $S_1$. Thus, cell 71 is uniquely addressed by selecting word line $W_1$ and sense line $S_1$. Any change in resistance of cell 71 can be easily and quickly sensed by connecting sensing apparatus between word line $W_1$ and sense line $S_1$. Further, diode 75 limits current flow through cell 71 (and all other cells in array 70 are similarly limited) and substantially prevents any other current paths from being formed in array 70.

Figure 7:
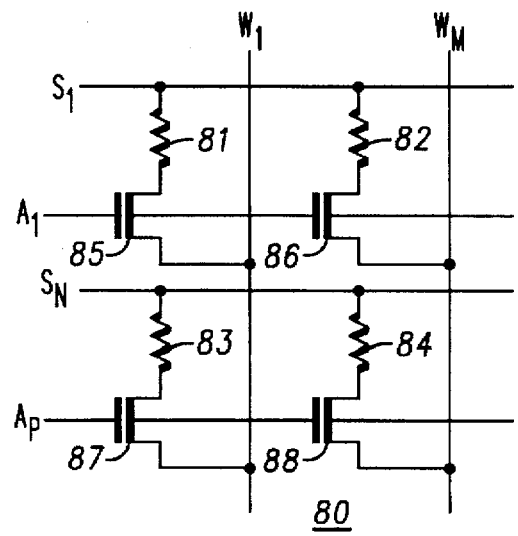
FIG. 7 is a schematic representation of yet another embodiment of an array of cells similar to those illustrated in FIG. 1.

Turning now to FIG. 7, still another embodiment of an array 80 of cells similar to cell 10 in FIG. 1 is illustrated with the cells being oriented in rows and columns. Only four cells 81 through 84 are illustrated for convenience, but it will be understood that any desired number of cells which can be practically fabricated can be employed. A plurality of transistors 85 through 88 are supplied, one each being associated with each cell 81 through 84. In this embodiment, one current carrying terminal of the associated transistor is connected to the lower or upper magnetic layer of the associated cell by means of an electrically conductive portion, which may include material such as a conductive layer, or solder, or the transistors may be integrated into a substrate or upper layer and formed with the conductive portion as a portion of the transistor. A second current carrying terminal of the transistor is connected to a sense line ($S_1$–$S_N$) and the other of the first and second magnetic layers of the cell are connected to a word line ($W_1$–$W_M$). Transistors 85 and 86 in the same row and transistors 87 and 88 in the same row have control terminals connected to an activation line ($A_1$–$A_P$). Thus, a complete row of transistors is activated at a time and sensing is again accomplished by selecting the sense line associated with the activated row and a word line connected to a desired cell in the activated row.

While the transistors add slightly to the apparatus, they provide additional safety and substantially eliminate any parallel current paths. Further, a selected state can be written in each cell without activating the cell. That is, writing current can be applied to a sense or a word and a write line to create a magnetic field around a specific cell without allowing current flow through the cell. Thus, writing and sensing are completely different actions, which is a substantial saving in operations and current.

Figure 8:
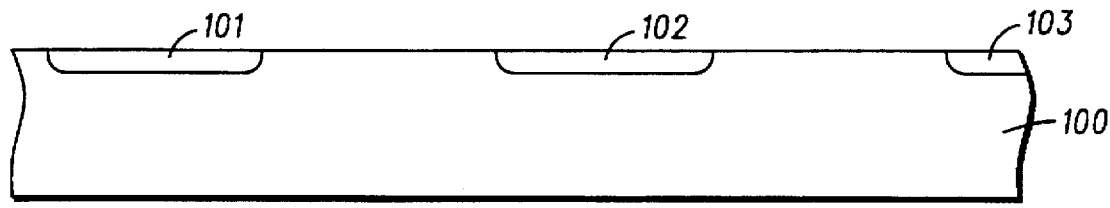
FIGS. 8 through 13 illustrate several steps in a fabrication process of an array of cells in accordance with the present invention.

Turning now to FIGS. 8 through 13, several steps are illustrated in a fabrication process of an array of cells in accordance with the present invention. Referring specifically to FIG. 8, a substrate 100 is illustrated, which may be for example a semiconductor wafer or any other convenient supporting structure. If a semiconductor wafer is utilized the added advantage of being able to use standard semiconductor manufacturing tools and equipment can be realized. A plurality of electrically conductive portions 101, 102, 103, etc. are provided by heavily doping areas of substrate 100 (implanting or diffusing material) utilizing well known techniques. Electrically conductive portions 101, 102, 103, etc. are arranged in rows and columns, for reasons which will be apparent presently.

Figure 9:
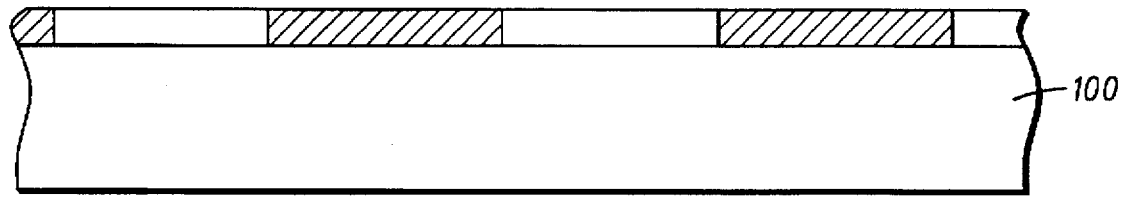
Figure 10:
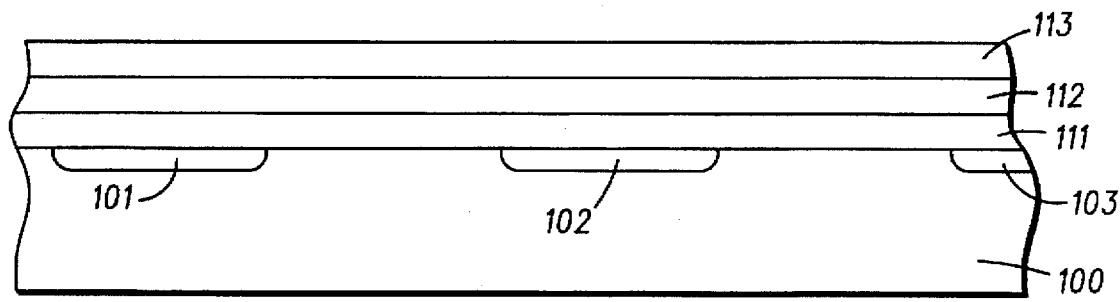
Figure 11:
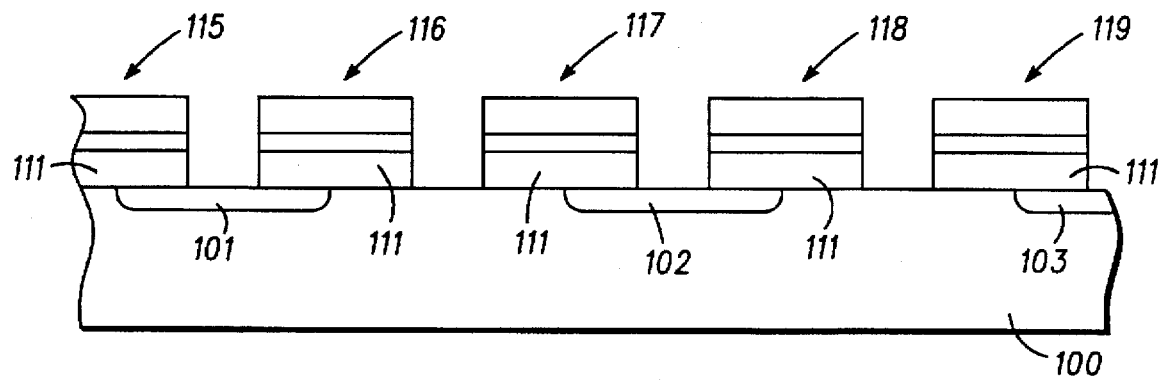

Electrically conductive portions could also be provided by depositing a layer of conductive material on the surface of the substrate, patterning the layer to provide electrically conductive portions and planarizing the surface by some convenient technique, such as spun-on-glass or the like, as illustrated in FIG. 9. This procedure might be especially useful when substrates other than semiconductor substrates are utilized. Utilizing substrate 100 of FIG. 8, a first layer of magnetic material 111 is deposited on the upper surface thereof, as illustrated in FIG. 10. An insulating layer 112 is deposited on the surface of layer 111 and another magnetic layer 113 is deposited on the surface of insulating layer 112. In a typical example in which semiconductor techniques are utilized, layers 111, 112, and 113 are deposited by sputtering. To ensure good electrical contact to the tunneling junction formed by layers 111, 112, and 113, non-magnetic conductive layers (not shown) may be deposited below and in contact with layer 111 and above and in contact with layer 113. Layers 111, 112, and 113 are then patterned and etched to define individual cells, as illustrated in FIG. 11. The structure can alternatively be selectively grown using standard mask liftoff techniques with MBE or ion beam sputtering. For convenience of this description any and all of these various methods will be referred to as "patterning".

The patterning is performed so as to define a plurality of multi-layer magnetic memory cells oriented in rows and columns corresponding with the rows and columns of electrically conductive portions 101, 102, 103, etc. and further oriented so that one each of electrically conductive portions 101, 102, 103, etc. is coupled to first layer 111 of magnetic material of a different adjacent pair of the plurality of multi-layer magnetic memory cells. As an example, in FIG. 11 the cells are designated 115 through 119. Cells 115 and 116 form an adjacent pair with magnetic layer 111 of each connected together by electrically conductive portion 101. Also, cells 117 and 118 form an adjacent pair with magnetic layer 111 of each connected together by electrically conductive portion 102.

Figure 12:
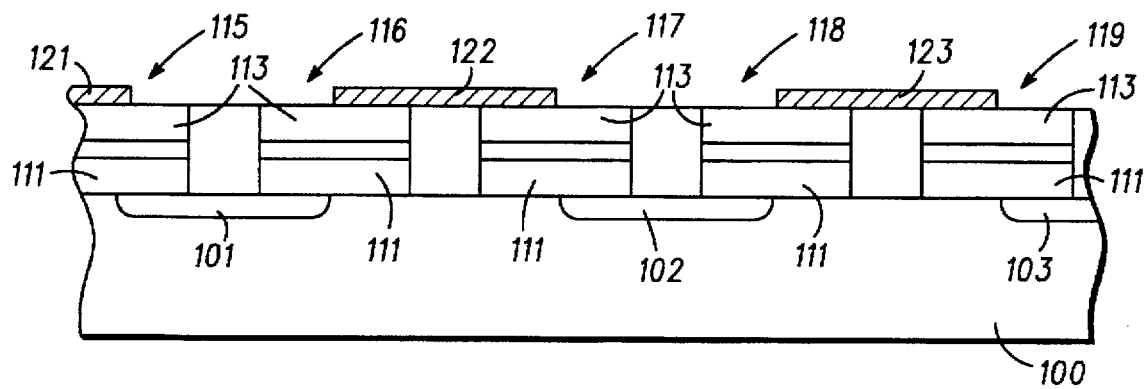
Figure 13:
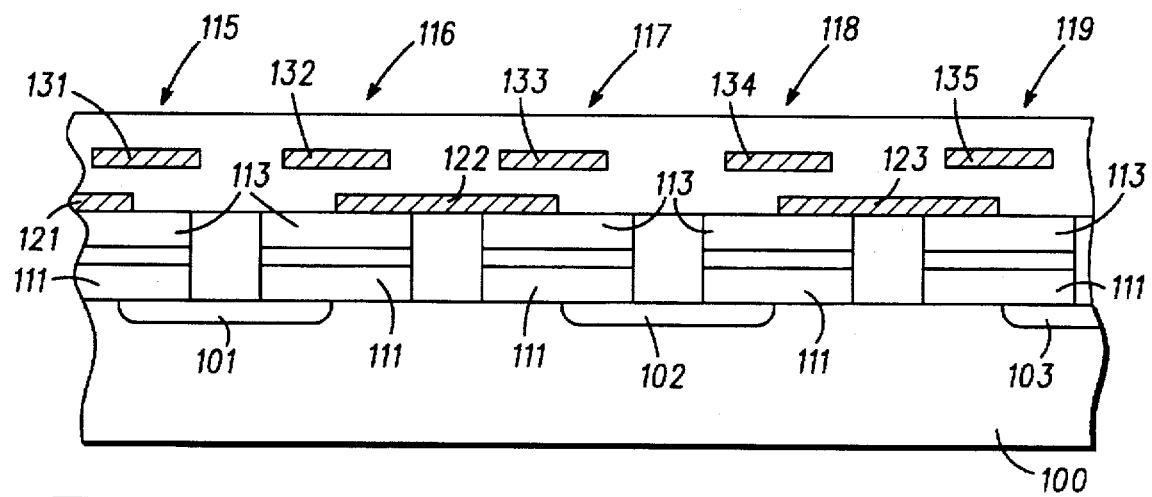

The entire array is then planarized by filling in the etched areas with a convenient nonconductive material, such as spun-on-glass or the like. Another electrically conductive layer is then deposited on the surface of the structure and patterned in some fashion to produce electrically conductive portions 121, 122, 123, etc. so as to operate in conjunction with electrically conductive portions 101, 102, 103, etc. to couple multi-layer magnetic memory cells 115, 116, 117, 118, 119, etc. in each row in a series connected configuration, as illustrated in FIG. 12. The entire structure can again be planarized and a plurality of word lines 131 through 135, one each associated with and positioned adjacent a column of cells, as illustrated in FIG. 13. In this example, word line 131 is positioned adjacent cell 115, word line 132 is positioned adjacent cell 116, etc. Alternatively, the word lines and electrically conductive portions 101, 102, 103r etc. can be buried in substrate 100 or in layers deposited on substrate 100.

Thus, very dense arrays of multi-state, multi-layer magnetic memory cells can be fabricated using well known and well developed semiconductor techniques. The presently disclosed multi-state, multi-layer magnetic memory cells are substantially simpler and easier to manufacture and use. Also, several embodiments are illustrated and disclosed which substantially reduce the amount of sense current required to read an array. Further, because of the reduced length of the current paths through the memory cells, sensing can be performed much faster than in previous types of memory cells (less than 50 ns). Because of the large change in resistance in the cells between states, sensing or reading the state stored in the cells is much easier and requires much simpler and less sensitive equipment.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A multi-state, multi-layer magnetic memory cell comprising:

a substrate having a surface;

a first electrically conductive portion positioned adjacent the surface of the substrate;

a first layer of magnetic material supported on the substrate in electrical contact with the first electrically conductive portion;

a layer of insulating material positioned on the first layer of magnetic material;

a second layer of magnetic material positioned on the layer of insulating material;

a second electrically conductive portion positioned in electrical contact with the second layer of magnetic material, the first layer of magnetic material, the layer of insulating material and the second layer of magnetic material forming a multi-layer magnetic memory cell with the first and second electrically conductive portions forming a sense line through the cell; and an electrically conductive word line positioned adjacent the multi-layer magnetic memory cell so as to provide a magnetic field, when the word line is activated, to at least partially switch magnetic vectors in one of the first and second layers of magnetic material from a first direction along a length of the one to a second, opposite direction, along the length of the one.

2. A multi-state, multi-layer magnetic memory cell as claimed in claim 1 including in addition a plurality of multi-state, multi-layer magnetic memory cells positioned on the substrate so as to form a two dimensional array of cells defining a plurality of rows and a plurality of columns of cells, with each sense line of each cell in a row being connected in series with all other sense lines in the row.

3. A multi-state, multi-layer magnetic memory cell as claimed in claim 2 wherein the electrically conductive word line extends parallel to a column of cells and is positioned adjacent to each multi-layer magnetic memory cell in the column so as to provide a magnetic field for each multi-layer magnetic memory cell in the column.

4. A multi-state, multi-layer magnetic memory cell comprising:

first and second layers of magnetic material each having a width that is less than a width of magnetic domain walls within the layer of magnetic material wherein magnetic vectors in the layers of magnetic material point along a length of the layers of magnetic material;

a layer of insulating material sandwiched between the first and second layers of magnetic material so as to form a multi-layer magnetic memory cell; and an electrically conductive word line positioned adjacent the multi-layer magnetic memory cell so as to provide a magnetic field, when the word line is activated, to at least partially switch the magnetic vectors in one of the first and second layers of magnetic material from a first direction along the length of the one to a second, opposite direction along the length of the one.

5. A multi-state, multi-layer magnetic memory cell as claimed in claim 4 including in addition a diode having a terminal connected to one of the first and second layers of magnetic material.

6. A multi-state, multi-layer magnetic memory cell as claimed in claim 4 including in addition a transistor having a terminal connected to one of the first and second layers of magnetic material.

7. An array of multi-state, multi-layer magnetic memory cells comprising:

a substrate having a surface;

a plurality of multi-layer magnetic memory cells supported on the substrate and defining rows and columns of multi-layer magnetic memory cells, each multi-layer magnetic memory cell of the plurality of multi-layer magnetic memory cells including a first electrically conductive portion positioned adjacent the surface of the substrate, a first layer of magnetic material supported on the substrate in electrical contact with the first electrically conductive portion, a layer of insulating material positioned on the first layer of magnetic material, a second layer of magnetic material positioned on the layer of insulating material, and a second electrically conductive portion positioned in electrical contact with the second layer of magnetic material, the first layer of magnetic material, the layer of insulating material and the second layer of magnetic material forming a multi-layer magnetic memory cell with the first and second electrically conductive portions forming a circuit in conjunction with the cell; and a plurality of electrically conductive word lines, one each associated with each column of multi-layer magnetic memory cells, the associated word line in each column being positioned adjacent each multi-layer magnetic memory cell in the column so as to provide a magnetic field to each multi-layer magnetic memory cell in the column.

8. An array of multi-state, multi-layer magnetic memory cells as claimed in claim 7 wherein the word line, when activated with a switching current, at least partially switches magnetic vectors in one of the first and second layers of magnetic material in each cell in the column from a first direction along a length of the one to a second, opposite direction, along the length of the one.

9. An array of multi-state, multi-layer magnetic memory cells as claimed in claim 7 wherein the circuit of each multi-layer magnetic memory cell in a row is connected in series with the circuit of each other multi-layer magnetic memory cell in the row to form a sense line.

10. An array of multi-state, multi-layer magnetic memory cells as claimed in claim 7 wherein one of the first and second electrically conductive portions of each multi-layer magnetic memory cell is coupled to the word line, and further including a plurality of sense lines, one each associated with each row of multi-layer magnetic memory cells with another of the first and second electrically conductive portions of each multi-layer magnetic memory cell being coupled to the associated sense line.

11. An array of multi-state, multi-layer magnetic memory cells as claimed in claim 7 including in addition a plurality of diodes, one each associated with each multi-layer magnetic memory cell, each diode having a first terminal connected to one of the first and second electrically conductive portions of the associated multi-layer magnetic memory cell.

12. An array of multi-state, multi-layer magnetic memory cells as claimed in claim 11 including in addition a plurality of sense lines, one each associated with each row of multi-layer magnetic memory cells and electrically connected to a second terminal of each diode in the row.

13. An array of multi-state, multi-layer magnetic memory cells as claimed in claim 12 wherein each of the plurality of multi-layer magnetic memory cells has another of the first and second electrically conductive portions, which is not connected to the first terminal of the diode, connected to the associated word line.

14. An array of multi-state, multi-layer magnetic memory cells as claimed in claim 7 including in addition a plurality of transistors, one each associated with each multi-layer magnetic memory cell, each transistor having a first current carrying terminal connected to one of the first and second electrically conductive portions of the associated multi-layer magnetic memory cell.

15. An array of multi-state, multi-layer magnetic memory cells as claimed in claim 14 including in addition a plurality of sense lines, one each associated with each row of multi-layer magnetic memory cells and electrically connected to a second current carrying terminal of each transistor in the row.

16. An array of multi-state, multi-layer magnetic memory cells as claimed in claim 15 including in addition a plurality of activation lines, one each associated with each row of multi-layer magnetic memory cells and electrically connected to a control terminal of each transistor in the row.

17. An array of multi-state, multi-layer magnetic memory cells as claimed in claim 7 wherein the first and second layers of magnetic material each have a width that is less than a width of magnetic domain walls within the layer of magnetic material such that magnetic vectors in the layers of magnetic material point substantially along a length of the layers of magnetic material.

18. A method of storing and sensing stored information in a multi-state, multi-layer magnetic memory cell comprising the steps of:

providing a multi-layer magnetic memory cell including a first electrically conductive portion, a first layer of magnetic material contacting the first electrically conductive portion, a layer of insulating material positioned on the first layer of magnetic material, a second layer of magnetic material positioned on the layer of insulating material, a second electrically conductive portion positioned in electrical contact with the second layer of magnetic material, and positioning an electrically conductive word line adjacent the multi-layer magnetic memory cell so as to provide a magnetic field, when the word line is activated, to partially switch magnetic vectors in the first layer of magnetic material from a first direction along a length of the first layer to a second, opposite direction, along the length of the first layer;

setting magnetic vectors in the second layer of magnetic material in the first direction;

storing information by producing a magnetic field around the multi-layer magnetic memory cell such that magnetic vectors in the first and second layers of magnetic material are parallel and in the first direction for a first logic symbol and in the second direction for a second logic symbol, the multi-layer magnetic memory cell producing a low resistance between the first and second electrically conductive portions for the first logic symbol and the second logic symbol and a high resistance when the magnetic vectors are antiparallel; and sensing stored information in the multi-layer magnetic memory cell by determining a resistance between the first and second electrically conductive portions.

19. A method of storing and sensing stored information in a multi-state, multi-layer magnetic memory cell as claimed in claim 18 wherein the step of storing information by producing a magnetic field includes introducing a first storing current into the word line and a second storing current into one of the first and second electrically conductive portions, the first and second storing currents producing a magnetic field sufficient to switch magnetic vectors in the first and second layers of magnetic material.

20. A method of storing and sensing stored information in a multi-state, multi-layer magnetic memory cell as claimed in claim 18 wherein the step of sensing stored information includes passing a sense current through the multi-layer magnetic memory cell, by way of the first and second electrically conductive portions, and measuring a voltage drop across the multi-layer magnetic memory cell.

21. A method of storing and sensing stored information in a multi-state, multi-layer magnetic memory cell as claimed in claim 20 wherein the step of passing a sense current through the multi-layer magnetic memory cell includes limiting the sense current to a value which is not sufficient to switch magnetic vectors in the second layer of magnetic material.

* * * * *

UNITED STATES PATENT AND TRADEMARK OFFICE
CERTIFICATE OF CORRECTION

PATENT NO. : 5,734,605 Page 1 of 1
DATED : March 31, 1998
INVENTOR(S) : Zhu et al.

It is certified that error appears in the above-identified patent and that said Letters Patent is hereby corrected as shown below:

<u>Column 1,</u>
Line 3, after the Title, please add as a new first paragraph the following paragraph:
     -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*